United States Patent [19]

Castéra et al.

[11] 4,318,061
[45] Mar. 2, 1982

[54] TUNABLE MICROWAVE OSCILLATOR USING MAGNETOSTATIC WAVES

[75] Inventors: Jean-Paul Castéra; Jean-Marie Dupont, both of Paris, France

[73] Assignee: Thomson-CSF, Paris, France

[21] Appl. No.: 115,080

[22] Filed: Jan. 24, 1980

[30] Foreign Application Priority Data

Jan. 26, 1979 [FR] France ............................... 79 02096

[51] Int. Cl.³ .............................................. H03H 9/00
[52] U.S. Cl. ................................ 331/107 A; 333/151; 333/153; 310/313 R
[58] Field of Search .......................... 331/107 A, 135; 333/151, 153, 154; 310/313 R, 313 D

[56] References Cited

U.S. PATENT DOCUMENTS

| 4,078,186 | 3/1978 | Folen et al. | 333/153 X |
| 4,097,825 | 6/1978 | Gerard | 333/151 |
| 4,209,759 | 6/1980 | Volluet | 333/153 |

OTHER PUBLICATIONS

Parker et al., "A Saw Oscillator Using Two Acoustic Paths", 1976 Ultrasonics Symposium Proceedings, pp. 243-247; 10-1976.

Primary Examiner—Siegfried H. Grimm
Assistant Examiner—Edward P. Westin
Attorney, Agent, or Firm—Oblon, Fisher, Spivak, McClelland & Maier

[57] ABSTRACT

Microwave oscillator using magnetostatic surface or bulk waves which can be transmitted in a thin layer of magnetic material having two cavity resonators with coupled gratings of different equivalent lengths in such a way that the first is multimode and the second monomode in the reflection pass band of the gratings, the cavities being arranged in such a way that the second filters the modes transmitted in the first. Microwave signals are applied to one of the two cavities and the resonated waves are collected in the second cavity.

7 Claims, 9 Drawing Figures

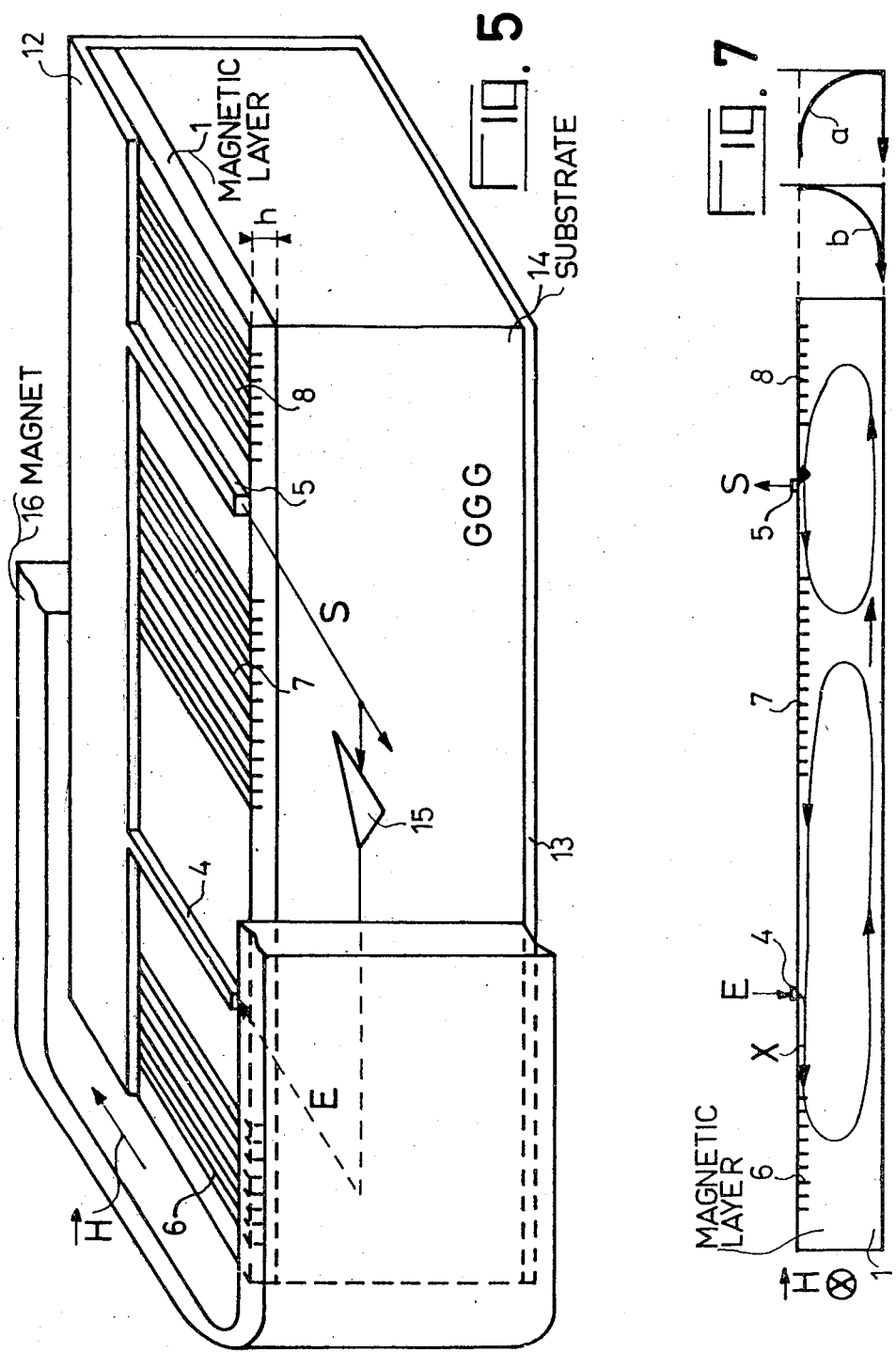

TUNABLE MICROWAVE OSCILLATOR USING MAGNETOSTATIC WAVES

BACKGROUND OF THE INVENTION

The invention relates to a microwave oscillator, which can be tuned by varying a magnetic field, using magnetostatic waves which can be transmitted in a thin layer of magnetic material.

In optics and acoustics, it is known to reflect a wave guided in a layer of an appropriate material by a grating formed in said layer. The transmission velocities of light waves and also sound waves are linked with the characteristics of the material constituting the layer and with the physical phenomenon in question. The pitch of the periodic structure defines the wavelength of the waves likely to be reflected. A resonator is formed by producing two systems between which the waves can be under standing wave conditions.

In order to obtain wave frequencies in the microwave range (typically 1–10 GHz), it is possible to use the transmission of so-called magnetostatic waves in a magnetic material. These waves, which are purely of the magnetic type, are due to the movement of the magnetization in the material. They are recited by means of a tranducer in which a microwave current circulates. The resonant frequency which can be obtained in a cavity between two systems is of the order of 1 GHz. This frequency can be made variable by modulating an external magnetic field. In general, such a resonator permits several oscillation modes in its pass band, the frequency spacing of these modes being inversely proportional to what is called the equivalent length of the cavity. For a given length, the number of modes is determined by the reflection pass band of the systems. To obtain a monomode oscillator from such a resonator, it would theoretically be possible to reduce the value of the equivalent length in order for there to be only a single mode in said pass band. However, the reduction in this value leads to a reduction in the quality of the resonator, which is incompatible with acceptable performances.

BRIEF SUMMARY OF THE INVENTION

The invention makes it possible to obtain a monomode oscillator with a high quality standard and a good rejection of frequencies other than the resonant frequency. To this end, the invention proposes a resonator with two coupled cavities, the microwave energy being coupled in the first cavity, which is a high quality multimode cavity. The second cavity, formed in the same layer as the first, receives part of the energy resonated in the first. The parameters of the second cavity are selected in such a way as to only have a single mode in the pass band of the systems, said mode having the same frequency as the main mode of the first. Part of the energy resonated in the second cavity is extracted. This device makes it possible to benefit from the advantages of the high quality of the first cavity whilst having only a single mode and the second cavity has a filtering action. The invention is of particular interest in the case of magnetostatic surface waves, which are unidirectional. It is thus possible only to couple the waves transmitted in a given direction. The invention can also use magnetostatic bulk waves in which case a less good rejection level is obtained because unidirectionality is lost, but the power levels obtained are much higher than with surface waves.

BRIEF DESCRIPTION OF THE DRAWINGS

The invention is described in greater detail hereinafter relative to non-limitative embodiments and the attached drawings, wherein show:

FIG. 5 a two-cavity oscillator according to the invention using surface waves.

FIG. 7 a sectional view of the oscillator of FIG. 5.

DETAILED DESCRIPTION OF THE PREFERRED EMBODIMENTS

Figure 1:
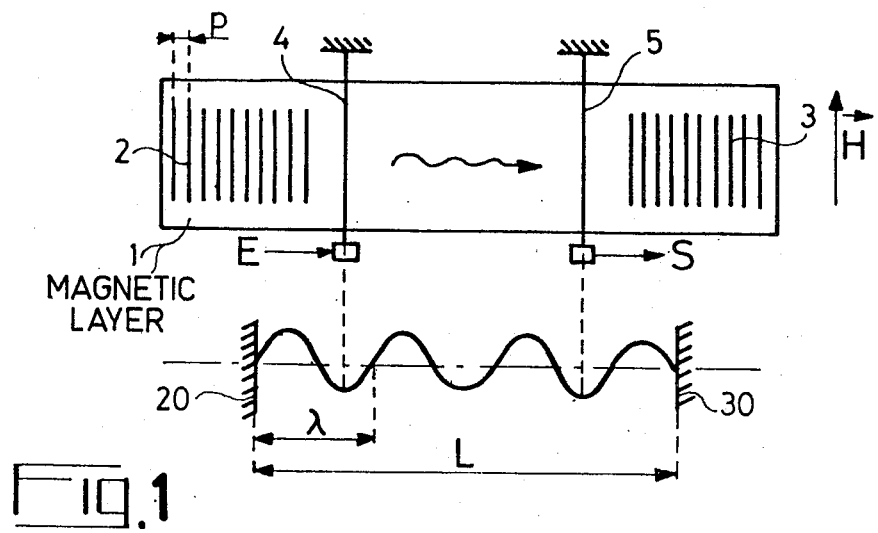
FIG. 1 a two system cavity resonator and its equivalent diagram.

FIG. 1 ahows the outer surface of a magnetic layer 1 of ferrimagnetic garnet, for example an yttrium-iron garnet (YIG) deposited on a gadolinium-gallium garnet (GGG) substrate. Layer 1 is a magnetized magnetic medium which is applied to a magnetic field $\vec{H}$ parallel to the plane of the layer. The interaction between the field applied and the magnetization permits the transmission of surface waves in the material, which has low magnetic losses. The transmission direction is perpendicular to the magnetic field applied. Two systems 2 and 3 of parallel, equidistant grooves of pitch p, which are perpendicular to the transmission direction are applied to the surface of layer 1. A magnetostatic wave input transducer 4 and an identical output transducer 5 are arranged between the two systems. Transducer 4 permits the coupling of magnetostatic waves in magnetic layer 1. Transducer 5 permits the extraction of the waves transmitted in the layer. The assembly formed between the two systems 2 and 3 constitutes a cavity. Thus, the systems reflect magnetostatic waves, whose wavelength $\lambda$ is equal to $\lambda_0 = 2p$. As for any cavity, it is possible to define for each system and equivalent reflector: reflectors 20 and 30 spaced by a length L which is the equivalent length of the cavity. Between the reflectors 20 and 30 is established a standing wave regime, the wavelength $\lambda$ of said waves checking the relation $L = n\lambda/2$ in which n is a random integer. A multimode resonator is obtained when a wave of suitable wavelength is coupled in the cavity, the spacing $\Delta f$ between the modes which is equal to $v/2L$ in which v is the wave velocity, makes it possible to empirically determine the value of L which is a fundamental characteristic of the resonator and which in particular depends on the distance between systems 2 and 3, the depth d of the grooves and the magnetic material. To obtain an effective coupling, it is necessary for the input and output transducers to be located at the position of a maximum of the standing waves. This situation is shown in the drawing. A resonator of the described type has been formed from a substrate of a gadolinium-gallium garnet on which has been deposited by epitaxial growth in the liquid phase a 10 micron thick layer 1 of pure yttrium-iron garnet. Saturation magnetization of the YIG layer is 1750 Oe. The pitch of the gratings has been made equal to 150 microns. Their grooves can be obtained for example by engraving or by ion bombardment causing local modifications over a certain thickness of the material. The wavelength of the exchanged waves is thus 300 microns. The field H applied was initially equal to 300 Oe. In this way, a resonant frequency equal to 2.6 GHz is obtained. This is the resonant frequency of the principal mode, the other modes being at a frequency spacing of value Δf defined hereinbefore. By varying for example the magnetic field applied from 100 to 500 Oe the frequency of the principal mode varies from 1.9 to 3.3 GHz.

Figure 2:
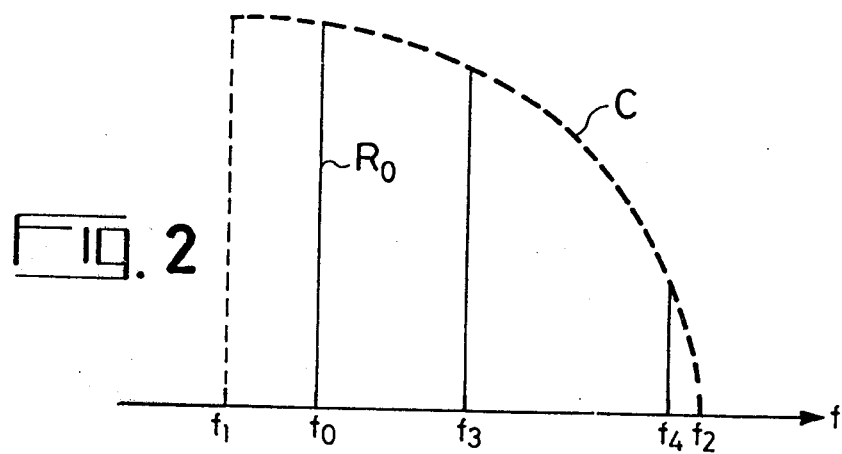
FIG. 2 the frequency diagram of a system of pitch p.

FIG. 2 shows the response diagram of a single system, such as system 2 of pitch p. The dispersion equation of the surface magnetostatic waves is $$k = \frac{2\pi}{\lambda} = \frac{1}{2d} L_n \left[ \frac{(2\pi M)^2}{(H + 2\pi M)^2 - \left(\frac{f}{\gamma}\right)^2} \right]$$

in which k and λ are respectively the wave number and wavelength of the magnetostatic waves, $L_n$ is the neper logarithmic function, 4 πM is the saturation magnetization of the magnetic material, H is the magnetic field which is applied parallel to the plane of the layer, f is the frequency of the magnetostatic waves and γ is the gyromagnetic ratio ($\gamma = 2.8 \cdot 10^6$ Hz/Oe). Moreover, λ verifies the relation $\lambda = \lambda_0/n$ where $\lambda_0 = 2p$. FIG. 2 shows in dotted line curve C which characterises the transmission between two transducers as a function of the frequency f on the basis of the dispersion relation. The frequency varies between the cut-off frequency $f_1$ corresponding to k=0 and $f_2$ corresponding to λ=0. The response diagram is in the form of frequency lines $f_o$, $f_3$, $f_4$ corresponding respectively to the wavelengths λ, $\lambda_0/2$, etc. There are several frequency lines between $f_1$ and $f_2$, the main frequency line $f_o$ corresponding to $\lambda_o$ is indicated $R_o$.

Figure 3:
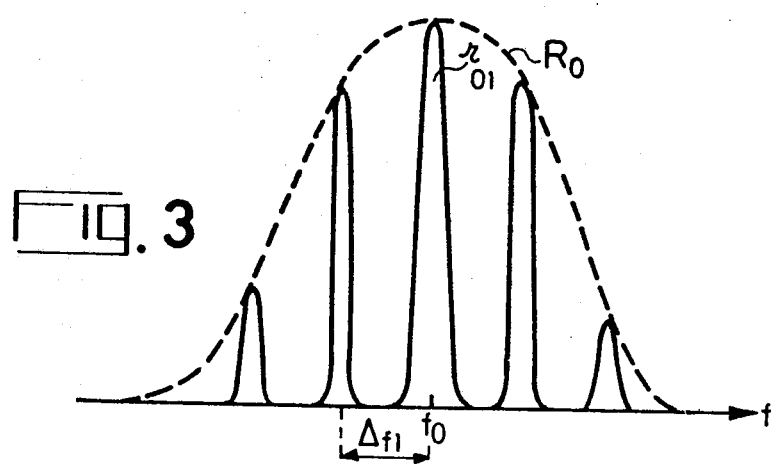
FIG. 3 the frequency diagram of a cavity of equivalent length $L_1$.

This line $R_o$ is shown on a larger scale and in dotted line form in FIG. 3. FIG. 3 illustrates the response line of a two-grating cavity, as shown in FIG. 1. Within the line $R_o$ there are several modes corresponding to the relation $L_1 = n\lambda_0/2$ in which $L_1$ is the equivalent length of the cavity. A principal mode $r_{01}$ is obtained for frequency $f_o$ and other modes on either side of the principal mode equidistant by a value $\Delta f_1$ defined by $\Delta f_1 = v/2L1$.

Figure 4:
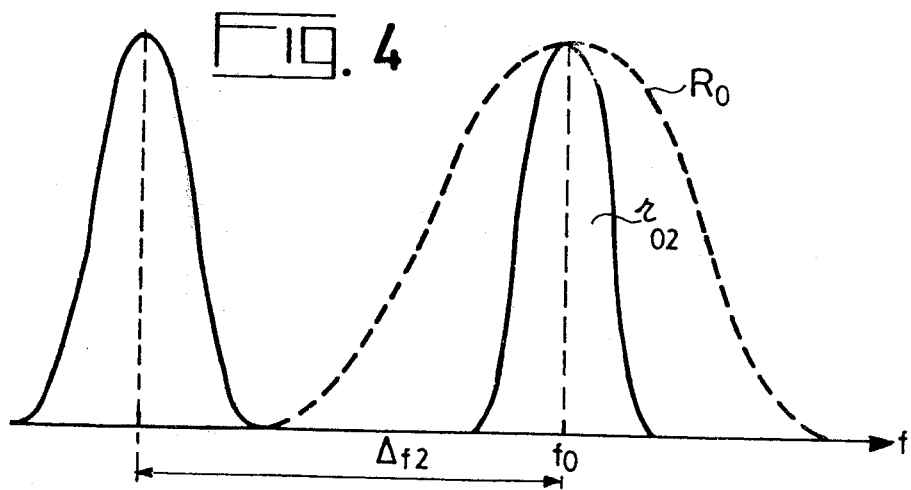
FIG. 4 the frequency diagram of another cavity of equivalent length $L_2$.

FIG. 4 shows on the same scale as FIG. 3 the response diagram of another cavity using the same systems, but of equivalent length $L_2$ less than the previous length $L_1$. Curve $R_o$ corresponding to the reflection response of the systems is identical to that of FIG. 3. The principal mode $R_{o2}$ is centered on the same frequency $f_o$ which, as stated hereinbefore, is linked with the pitch of the systems. The spacing between two adjacent modes $\Delta f_2$ is inversely proportional to the length of the cavity, so that it is larger than the spacing $\Delta f_1$. FIG. 4 shows that in the range in curve $R_o$, there is only a single mode, but that this mode has a wider band than the principal mode of FIG. 3. Thus, it is possible to obtain a resonator only having a single mode in the main reflection line by choosing a sufficiently small cavity length, but this then occurs to the detriment of the resonator quality standard. As will be seen, the invention makes it possible to obtain a single mode with a resonator having a quality standard which is just as good as that of a longer cavity.

Figure 6:
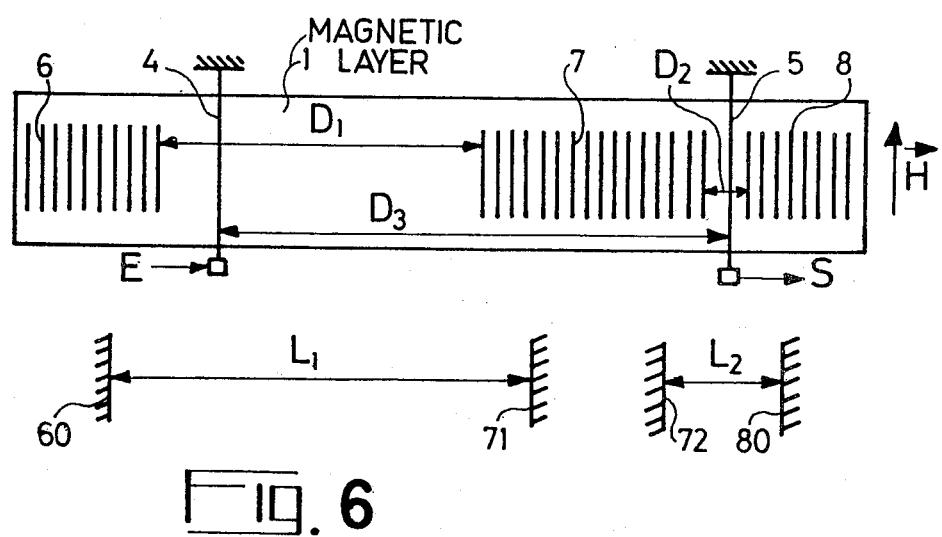
FIG. 6 a plan view of the oscillator of FIG. 5.

FIG. 5 shows an oscillator according to the invention having a GGG substrate 14 on which is axially grown a YIG layer 1 of thickness h. The assmebly is subject to the action of a magnetic field H parallel to the layer, obtained for example by conventional electromagnetic means partly shown at 16. On the outer surface of the layer are provided systems 6, 7 and 8 which are parallel to the field H and of the same pitch, obtained for example by ionic bombardment. These systems define two cavities, one between the systems 6 and 7 and the other between systems 7 and 8. A signal E from a negative resistance amplifier circuit 15 is applied to an input transducer 4 in the first cavity at an appropriate point as defined hereinbefore and the output signal S applied to the input of circuit 15 is extracted from a transducer 5 arranged in the same second cavity. The two transducers are microstrips deposited on the YIG surface perpendicular to the transmission direction of the magnetic waves, i.e. parallel to the systems and to field H. One of the ends of each transducer is connected to a metal layer 13 positioned on the free surface of substrate 14 and which is extended by covering part 12 of the outer surface of the YIG layer with a view to joining to transducers 4 and 5. In certain cases, in order to reduce the coupling of the magnetostatic waves in the transducers, it may be advantageous to position a thin film of silica which forms an insulator between the YIG and the microstrips forming the transducers. The waves coupled by transducer 4 are resonated in the first cavity between systems 6 and 7. Part of the unreflected waves in system 7 is transmitted to the second cavity between systems 7 and 8. These are the waves which are resonated in the second cavity and are extracted by transducer 5. The lengths of the two cavities are selected in such a way that the first cavity behaves like a multimode filter and has a good quality standard and the second cavity behaves like a monomode filter. Their response diagrams are shown in FIGS. 3 and 4 respectively. Thus, the second cavity is used as a mode selector of the waves resonated in the first cavity. The extracted waves benefit from the good quality standard of the first cavity, whilst only having a single mode in the reflection pass band of the gratings. FIGS. 6 and 7 are explanatory diagrams in the plane of the oscillator shown in FIG. 5. FIG. 6 is a plan view on which are also shown the equivalent diagrams of the two cavities, the first cavity comprising two reflectors 60 and 71 spaced by length $L_1$, whilst the second cavity comprises two reflectors 72 and 80 spaced by a length $L_2$. The oscillator is made from a YIG layer of thickness h = 16 μm, gratings of engraved grooves of depth 2.8 μm and with a chosen wavelength of 300 μm. The transmission velocity of the waves is equal to $1.64 \times 10^5$ m/s in such a layer. The distance $D_1$ between the gratings 6 and 7 is equal to 1500 μm, whilst the distance $D_2$ between gratings 7 and 8 equal to pitch p is 150 μm. The distance between the transducers 4 and 5 is equal to 3000 μm and their length 250 μm. It has been possible to experimentally determine the location of the equivalent reflectors and the lengths of the two cavities. Reflector 80 is 700 μm from transducer 5 and reflectors 71 and 72 are at a distance of 665 μm. In the case of the first cavity $L_1 = 2730$ μm giving a mode spacing of $\Delta f_1 = 30$ MHz, whilst for the second cavity $L_2 = 1230$ μm corresponding to $\Delta f_2 = 66.7$ MHz. The reflection pass band of the gratings is equal to 80 MHz, so that the first cavity has three modes in this band, whilst the second cavity only has one. The magnetic field applied has been varied in such a way that a variation in the resonant frequency between 2 and 4.6 GHz is obtained. It should be noted that the oscillator only has a single oscillation frequency with a rejection of 16dB and a quality standard equal to 500. The frequency range indicated is only given for information and larger ranges can be obtained.

FIG. 7 is a sectional view of the oscillator according to the invention showing the path taken by the surface magnetostatic waves within the thickness of the layer. It is known that for a given direction of the magnetic field applied, the waves transmitted in one of the transmission directions tend to be localised at the YIG-air interface and the waves transmitted in the other direction tend to be localized at the YIG-GGG interface. Curves A and B show the energy distribution of the waves throughout the thickness of the layer, respectively for the two transmission directions. Consequently, for effectively coupling by tranducer 4 of the waves in the first and second cavities only the magnetic field direction is chosen in such a way that the waves from transducer 4 pass in direction X towards grating 6. The waves are then resonated between gratings 6 and 7 in direction X on the outer surface of the device and in the opposite direction to the YIG-GGG interface and it is the latter waves which are coupled in the second cavity. Thus, the coupling is unidirectional and only the waves already resonated in the first cavity are collected by the second, which ensures a good quality. In the same way, for the second cavity only the waves transmitted in direction X are collected by transducer 5, i.e. only the waves resonated in the second cavity or in other words filtered and consequently only having a single resonant mode are obtained at the output. As the second cavity only receives waves of wavelength $\lambda = \lambda_o = 300$ μm instead of receiving the complete spectrum, the rejection of frequencies not in the resonant range is increased compared with the rejection of a single cavity.

Figure 8:
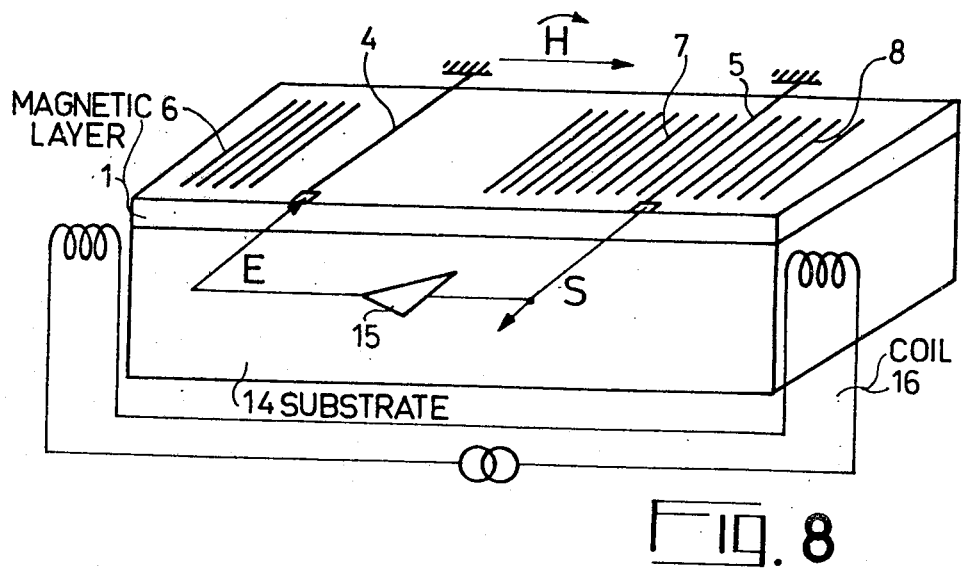
FIGS. 8 and 9 oscillators using bulk waves.
Figure 9:
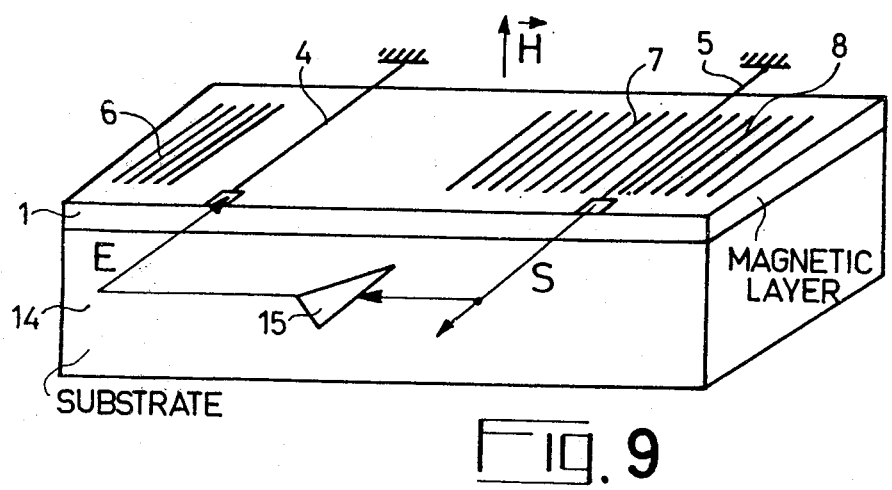

The invention can also use magnetostatic bulk waves. These waves are produced when the field applied is either perpendicular to the YIG layer or parallel to the plane of the layer and to the transmission direction of the waves. FIG. 8 shows a bulk wave oscillator in which the magnetic field $\vec{H}$ is in the plane of the layer and perpendicular to the grooves of the gratings. FIG. 9 shows a bulk wave oscillator in which the magnetic field $\vec{H}$ is perpendicular to the plane of the layer. The structure of these oscillators is very close to that of the surface wave oscillator shown in FIG. 5. In both cases, the unidirectionality of the coupling cannot be retained, so that the rejection level obtained is not as good as when surface waves are used. However, the power which can be obtained at the output is much higher than the power which can be obtained with surface waves, e.g. 20 mW instead of 100 μW. The operation of a bulk wave resonator is roughly the same as that described hereinbefore. The dispersion equation and the rules for such modes differ only slightly with different transmission velocities. As in the previous case, the waves are selected by the first cavity, the second cavity filtering a single mode from among the various modes of the first cavity.

The invention is not limited to the embodiments described and represented hereinbefore and various modifications can be made thereto without passing beyond the scope of the invention.

What is claimed is:

1. A microwave oscillator which can be tuned by a variation of a magnetic field, comprising:

two coupled cavities formed in a magnetic material layer and forming a first resonator used as a multimode filter and a second resonator used as a monomode filter, respectively with the second resonator filtering one of the modes transmitted in said first resonator, an input transducer for exciting magnetostatic waves in said first cavity;

an output transducer for an extraction of a signal corresponding to the waves transmitted in said second cavity;

amplifier means with an input and an output respectively connected to said output transducer and said input transducer; and electromagnetic means for subjecting said two cavities to an external magnetic field.

2. An oscillator according to claim 1, wherein the magnetic material is an yttrium-iron garnet deposited in layer form on a gadolinium-gallium garnet substrate.

3. An oscillator according to claim 1, wherein each cavity has two gratings with equidistant grooves, one of the gratings of said first cavity being common to one of the gratings of said second cavity.

4. An oscillator according to claim 1, wherein said input transducer and output transducer respectively have a microstrip with first and second ends deposited on the layer respectively in the first and second cavities, the first ends being connected to a common earth and the second ends being respectively connected to the input and to the output of amplifier means.

5. An oscillator according to claim 1, wherein the direction of said magnetic field is parallel to the plane of said layer and perpendicular to the transmission direction of said waves and its direction is such that said input transducer in said first cavity only produces waves transmitted in a direction moving away from said second cavity.

6. An oscillator according to claim 1, wherein said magnetic field is parallel to the plane of said layer and parallel to the wave transmission direction.

7. An oscillator according to claim 1, wherein said magnetic field is perpendicular to the plane of said layer.

* * * * *